US012772848B2

(12) United States Patent
Kang et al.

(10) Patent No.: US 12,772,848 B2
(45) Date of Patent: Oct. 20, 2026

(54) SEMICONDUCTOR DEVICE

(71) Applicant: SAMSUNG ELECTRONICS CO., LTD., Suwon-si (KR)

(72) Inventors: Sungchan Kang, Suwon-si (KR); Dongkyun Kim, Suwon-si (KR); Daehyuk Son, Suwon-si (KR); Hotaik Lee, Suwon-si (KR); Seogwoo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 18/647,903

(22) Filed: Apr. 26, 2024

(65) Prior Publication Data

US 2025/0157883 A1 May 15, 2025

(30) Foreign Application Priority Data

Nov. 13, 2023 (KR) ........................ 10-2023-0156314

(51) Int. Cl.
*H10W 40/47* (2026.01)
*H10W 90/00* (2026.01)

(52) U.S. Cl.
CPC ........... *H10W 40/47* (2026.01); *H10W 90/00* (2026.01)

(58) Field of Classification Search
CPC ...... H10W 40/47; H10W 40/73; F28D 15/046
See application file for complete search history.

(56) References Cited

U.S. PATENT DOCUMENTS

2005/0280162 A1 12/2005 Mok et al.
2010/0139894 A1 6/2010 Zhou et al.
2012/0170221 A1 7/2012 Mok
2020/0248968 A1 8/2020 Chen et al.
2020/0281095 A1 9/2020 Rush et al.
2021/0041182 A1 2/2021 Eid et al.
2022/0104399 A1 3/2022 Shaikh et al.
(Continued)

FOREIGN PATENT DOCUMENTS

KR 10-2024-0094775 A 6/2024

OTHER PUBLICATIONS

Lin, Po-Yao et al., "Advanced Thermal Integration for HPC Packages with Two-Phase Immersion Cooling", 2022 IEEE 72nd Electronic Components and Technology Conference (ECTC), pp. 566-573. (8 pages total).

(Continued)

*Primary Examiner* — Marlon T Fletcher
*Assistant Examiner* — Samuel Jonathan Smith
(74) *Attorney, Agent, or Firm* — Sughrue Mion, PLLC

(57) ABSTRACT

A semiconductor device includes a semiconductor chip having a semiconductor integrated circuit. A cooling channel is formed in the semiconductor chip. At least a portion of the cooling channel is formed in the semiconductor chip. First wick structures may be arranged on a bottom of the cooling channel that is parallel to an upper surface of the semiconductor chip in a transverse direction. The first wick structures may move a liquid coolant by capillary action in the transverse direction along the bottom of the cooling channel. Second wick structures may be arranged along an inner surface of the vapor chamber and may move the liquid coolant by capillary action in the transverse direction along the inner surface of the vapor chamber.

20 Claims, 10 Drawing Sheets

(56) References Cited

U.S. PATENT DOCUMENTS

| | | | | |
|---|---|---|---|---|
| 2023/0089958 | A1 | 3/2023 | Wu | |
| 2023/0317548 | A1 * | 10/2023 | Hazra ................. | H10W 40/226 361/697 |
| 2024/0203821 | A1 | 6/2024 | Kang et al. | |

OTHER PUBLICATIONS

Mudawar, Issam, "Assessment of High-Heat-Flux Thermal Management Schemes", IEEE Transactions on Components and Packaging Technologies, vol. 24, No. 2, Jun. 2001, pp. 122-141. 20 pages total).
"ICT Energy Strategic Research Agenda", ICT Energy (No. 611004), Strategic Research Agenda, Oct. 2016. (60 pages total).
"Heterogeneous Integration Roadmap, Chapter 20: Thermal", 2021 Edition, http://eps.ieee.org/hir. (28 pages total).
"High-performance computing server cooling system technology status", Korea Institute of Science and Technology Information, 2018. (72 pages total).
"Samsung will keep using heat pipes in 2018, 2019 might bring vapor chambers", GSMArena.com, https://www.gsmarena.com/samsung_will keep_using_heat_pipes_in_2018-news-28299.php. (2 pages total).
Communication issued Feb. 18, 2025 by the European Patent Office in European Patent Application No. 24196647.2.

* cited by examiner

SEMICONDUCTOR DEVICE

CROSS-REFERENCE TO RELATED APPLICATION

This application is based on and claims priority under 35 U.S.C. § 119 to Korean Patent Application No. 10-2023-0156314, filed on Nov. 13, 2023, in the Korean Intellectual Property Office, the disclosure of which is incorporated by reference herein in its entirety.

BACKGROUND

1. Field

Embodiments of the present disclosure relate to a semiconductor device having a two-phase liquid cooling structure.

2. Description of the Related Art

Air cooling devices have been widely used for dissipating heat generated from electronic devices. However, as the power density of electronic devices has gradually increased, the use of liquid cooling devices to handle a large amount of heat has also increased. Moreover, to reduce the power consumption of data centers, there is gradually increasing interest in next-generation high-efficiency cooling systems such as liquid cooling devices. Liquid cooling methods may be classified, based on the temperature range of heat-generating components, into a single-phase liquid cooling type involving no phase change of a coolant and a two-phase liquid cooling type involving phase changes of a coolant. Two-phase liquid cooling methods may be used to process heat in a wider range than single-phase liquid cooling methods.

SUMMARY

Embodiments of the present disclosure include a semiconductor device employing a two-phase liquid cooling structure.

Embodiments of the present disclosure include a semiconductor device including a vapor chamber having an extended heat transfer surface.

Embodiments of the present disclosure include a semiconductor device employing a two-phase liquid cooling structure to address a decrease in cooling efficiency caused by bubbles adsorption on a heating surface.

Embodiments of the present disclosure include a semiconductor device that does not require additional power to move a cooling fluid.

According to embodiments of the present disclosure, a semiconductor device is provided and includes: a semiconductor chip including a cooling channel recessed in the semiconductor chip from an upper surface of the semiconductor chip, the cooling channel configured to have a liquid coolant flow therein such as to absorb heat generated during an operation of the semiconductor chip; first wick structures on a bottom of the cooling channel that is parallel to the upper surface of the semiconductor chip in a transverse direction, the first wick structures configured to move the liquid coolant by capillary action in the transverse direction along the bottom of the cooling channel; a vapor chamber above the semiconductor chip and in fluid communication with the cooling channel; second wick structures on an inner surface of the vapor chamber and configured to move the liquid coolant by capillary action in the transverse direction along the inner surface of the vapor chamber; and third wick structures between the first wick structures and the second wick structures and configured to move the liquid coolant from the second wick structures to the first wick structures by capillary action.

According to one or more embodiments of the present disclosure, the first wick structures include a material that is different from a material included in the second wick structures.

According to one or more embodiments of the present disclosure, the first wick structures include silicon, and the second wick structures include copper.

According to one or more embodiments of the present disclosure, the third wick structures include copper.

According to one or more embodiments of the present disclosure, the third wick structures connect together some of the first wick structures and some of the second wick structures that are closest to a step formed between the vapor chamber and the upper surface of the semiconductor chip, and the third wick structures are spaced apart from the step toward an inside of the cooling channel by a capillary distance.

According to one or more embodiments of the present disclosure, the third wick structures have a conductive wire shape extending between upper surfaces of the first wick structures and upper surfaces of the second wick structures.

According to one or more embodiments of the present disclosure, the third wick structures include: first vertical capillary channels configured to move the liquid coolant in a vertical direction between the third wick structures; and second vertical capillary channels configured to move the liquid coolant in the vertical direction between the step and the third wick structures.

According to one or more embodiments of the present disclosure, the semiconductor device further includes fourth wick structures that connect together at least some of the first wick structures and at least some of the second wick structures that face each other.

According to one or more embodiments of the present disclosure, the fourth wick structures have a conductive wire shape extending between upper surfaces of the first wick structures and upper surfaces of the second wick structures.

According to one or more embodiments of the present disclosure, the semiconductor device further includes a package housing surrounding the semiconductor chip, wherein the upper surface of the semiconductor chip is exposed from the package housing, wherein the vapor chamber is on an upper portion of the package housing.

According to one or more embodiments of the present disclosure, the second wick structures include: 2nd-1 wick structures facing the first wick structures; 2nd-2 wick structures facing the 2nd-1 wick structures; and 2nd-3 wick structures between the 2nd-1 wick structures and the 2nd-2 wick structures.

According to one or more embodiments of the present disclosure, the semiconductor device further includes an additional semiconductor chip under the 2nd-2 wick structures and within the package housing.

According to embodiments of the present disclosure, a semiconductor device is provided and includes: a plurality of semiconductor chips stacked in a vertical direction, the plurality of semiconductor chips including a plurality of cooling channels respectively recessed in the plurality of semiconductor chips from upper surfaces of the plurality of semiconductor chips, the plurality of cooling channels configured to have a coolant flow in a liquid phase therein such as to absorb heat generated during an operation of the plurality of semiconductor chips; a plurality of first wick structures on bottoms of the plurality of cooling channels that are respectively parallel to the upper surfaces of the plurality of semiconductor chips in a transverse direction, the plurality of first wick structures configured to move the coolant by capillary action in the transverse direction along the bottoms of the plurality of cooling channels; a vapor chamber above an uppermost semiconductor chip among the plurality of semiconductor chips, the vapor chamber being in fluid communication with the plurality of cooling channels; second wick structures on an inner surface of the vapor chamber and configured to move the coolant by capillary action in the transverse direction along the inner surface of the vapor chamber; a connection channel penetrating the plurality of semiconductor chips except for lowermost semiconductor chip among the plurality of semiconductor chips; third wick structures between the second wick structures and first wick structures, among the plurality of first wick structures, that are arranged on the uppermost semiconductor chip among the plurality of semiconductor chips, the third wick structures configured to move the coolant in the liquid phase by capillary action from the second wick structures to the first wick structures; and at least one fourth wick structure configured to move the coolant in the liquid phase by capillary action along the connection channel from the second wick structures to at least one of the plurality of first wick structures.

According to one or more embodiments of the present disclosure, the plurality of first wick structures include a material that is different from a material included in the second wick structures.

According to one or more embodiments of the present disclosure, the plurality of first wick structures include silicon, and the second wick structures include copper.

According to one or more embodiments of the present disclosure, the third wick structures and the at least one fourth wick structure include copper.

According to one or more embodiments of the present disclosure, the third wick structures connect together some of the first wick structures and some of the second wick structures that are closest to a step formed between the vapor chamber and the upper surfaces of the plurality of semiconductor chips, and wherein the third wick structures are spaced apart from the step toward an inside of the plurality of cooling channels by a capillary distance.

According to one or more embodiments of the present disclosure, the at least one fourth wick structure includes fourth wick structures that are spaced apart from a side wall of the connection channel toward the inside of the plurality of cooling channels by a capillary distance.

According to one or more embodiments of the present disclosure, the semiconductor device further includes fifth wick structures connecting together some of the first wick structures and some of the second wick structures that face each other, wherein the some of the first wick structures are on the uppermost semiconductor chip among the plurality of semiconductor chips.

According to one or more embodiments of the present disclosure, the semiconductor device further includes a plurality of package housings respectively surrounding the plurality of semiconductor chips, wherein the upper surfaces of the plurality of semiconductor chips are exposed from the plurality of package housings, respectively, and the vapor chamber is on an upper portion of one of the plurality of package housings that surrounds the uppermost semiconductor chip among the plurality of semiconductor chips.

Additional aspects will be set forth in part in the description which follows and, in part, will be apparent from the description, or may be learned by practice of the example embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
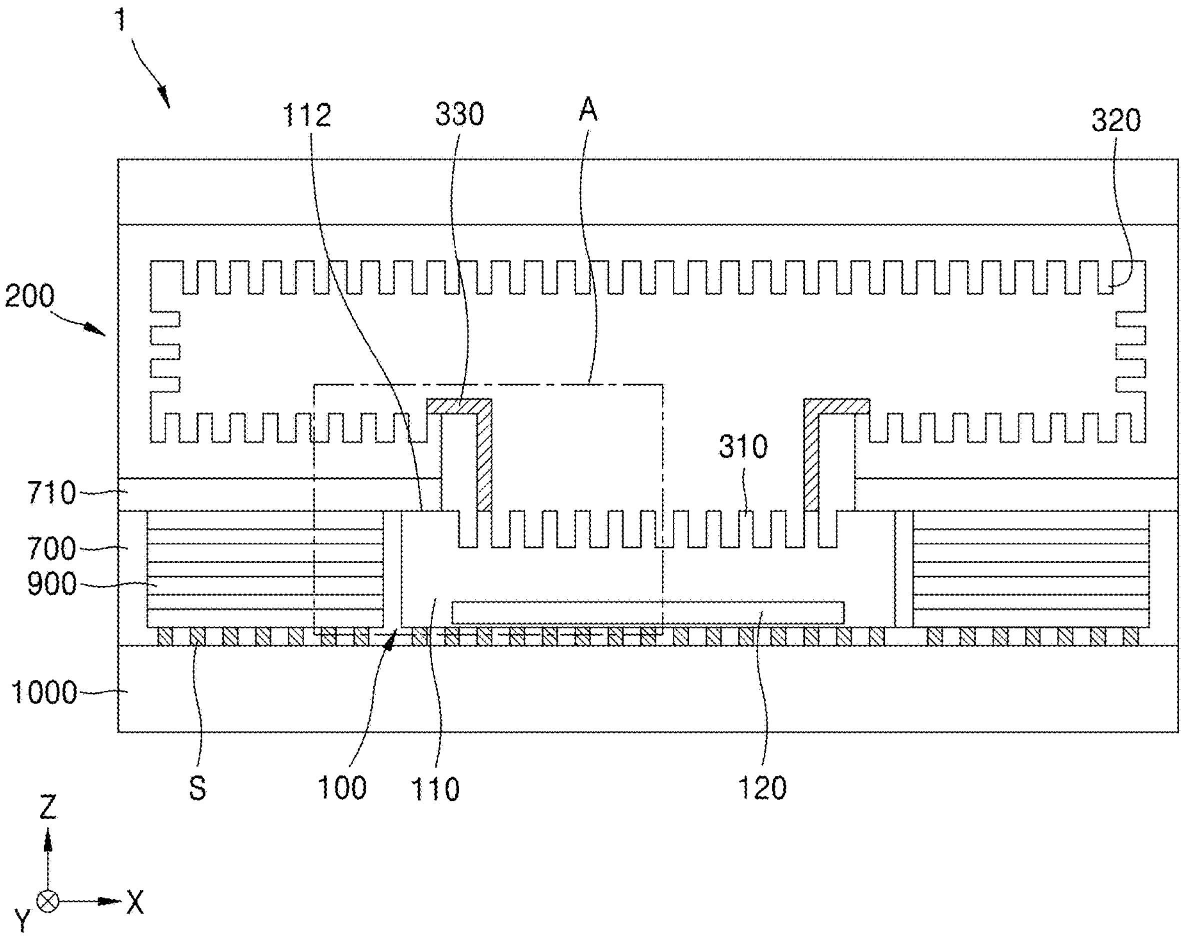
FIG. 1 is a view schematically illustrating a configuration of a semiconductor device according to an embodiment.

Reference will now be made in detail to embodiments, examples of which are illustrated in the accompanying drawings, wherein like reference numerals refer to like elements throughout. In this regard, embodiments of the present disclosure may have different forms and should not be construed as being limited to the descriptions set forth herein. Accordingly, the example embodiments are merely described below, by referring to the figures, to explain example aspects of the present disclosure. As used herein, the term "and/or" includes any and all combinations of one or more of the associated listed items. Expressions such as "at least one of," when preceding a list of elements, modify the entire list of elements and do not modify the individual elements of the list.

In the drawings, the sizes of elements may be exaggerated for clarity of illustration. In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" (or "includes") and/or "comprising" (or "including") used herein specify the presence of stated features or elements, but do not preclude the presence or addition of one or more other features or elements. An element referred to with a definite article or a demonstrative determiner may be construed as the element or the elements even though it has a singular form. Operations of a method may be performed in an appropriate order unless explicitly described in terms of order or described to the contrary, and are not limited to the stated order thereof. In the present disclosure, terms such as "unit" or "module" may be used to denote a unit that has at least one function or operation and is implemented with hardware, software, or a combination of hardware and software. Furthermore, line connections or connection members between elements depicted in the drawings represent functional connections and/or physical or circuit connections by way of example, and in actual applications, they may be replaced or embodied with various additional functional connections, physical connections, or circuit connections. Examples and terms are just used herein to describe example technical ideas and should not be considered for purposes of limitation of the present disclosure.

Efficient cooling systems are required to solve cooling problems that limit the performance of electronic devices including semiconductor chips. In the fields of high-performance computing (HPC) and semiconductor devices including stacked three-dimensional (3D) semiconductor chips, cooling systems are required to handle an increase in power density and an increase in the amount of heat generated by highly integrated circuits. To this end, a two-phase liquid cooling system capable of using the latent heat of vaporization of a coolant may be applied to semiconductor devices. Examples of two-phase liquid cooling methods include immersion cooling, spray cooling, and jet impingement cooling.

Immersion cooling is a method of cooling an electronic device by immersing the electronic device in a bath containing a liquid coolant. Although immersion cooling is most widely used, immersion cooling is limited to using dielectric coolants because electronic devices are immersed in liquid coolant. Therefore, immersion cooling incurs high maintenance costs and is not ecofriendly. In addition, cooling efficiency may decrease due to coolant vapor bubbles adsorbed on a heating surface of an electronic device. In a boiling graph, this phenomenon is called "critical heat flux (CHF)." An increase in CHF guarantees cooling for a higher heat flux.

Spray cooling is a method of atomizing a liquid coolant and spraying the atomized liquid coolant on a heating surface. Spray cooling guarantees high cooling efficiency compared to the amount of liquid coolant used. However, spray cooling devices require a pumping device capable of operating at high pressure and spray nozzles require regular maintenance and repair. In addition, when a film boiling phenomenon in which bubbles of vapor coolant are adsorbed on a heating surface occurs, the bubbles hinder heat transfer from the heating surface to the coolant, thereby reducing cooling efficiency.

Jet impingement cooling is a method of ejecting a liquid coolant on a heating surface at high speed. Although jet impingement cooling guarantees high cooling efficiency like spray cooling, jet impingement cooling requires multiple injectors for evenly cooling a heating surface. Moreover, blind spots may occur even when multiple injectors are used.

In a two-phase liquid cooling system of embodiments of the present disclosure, at least a portion of a cooling channel functioning as a coolant passage is formed inside an object to be cooled. In other words, the cooling channel may be entirely formed in the object to be cooled by recessing a surface (e.g., an upper surface) of the object. The object to be cooled may be, for example, a semiconductor chip (e.g., an integrated circuit die). A cross-sectional region of the cooling channel may include: a liquid channel region provided with a fine pattern configured to generate capillary force such that liquid coolant may flow in the liquid channel region; and a vapor channel region not provided with a capillary structure such that vapor coolant may flow in the vapor channel region. The liquid channel region and the vapor channel region are not physically separated from each other and are distinguished from each other based on the fine pattern. In the liquid channel region, a coolant absorbs heat from a heating surface adjacent to a heating source and changes into vapor. According to embodiment of the present disclosure, vapor (e.g., bubbles) generated in the liquid channel region may move to the vapor channel region and may escape to the outside of the cooling channel along the vapor channel region. Liquid coolant is filled in a portion of the liquid channel region from which bubbles are discharged by a capillary force generated by wick structures. According to this configuration, because bubbles are easily separated from the heating surface, cooling efficiency may be improved, and the formation of hot spots may be reduced or prevented. In addition, the fine pattern increases an area in which heat exchange occurs with liquid coolant, thereby facilitating heat exchange with a heat source. In addition, because liquid coolant flows along the liquid channel region by capillary force, a coolant supply device such as a high-capacity pump for supplying liquid coolant to the cooling channel is not required, thereby reducing manufacturing costs and power consumption of the two-phase liquid cooling system.

In the following description, a direction X refers to one of directions parallel to the upper surface of a semiconductor chip. A direction Z refers to the thickness direction of the semiconductor chip. A direction Y refers to a direction orthogonal to the direction X among directions parallel to the upper surface of the semiconductor chip.

Figure 2:
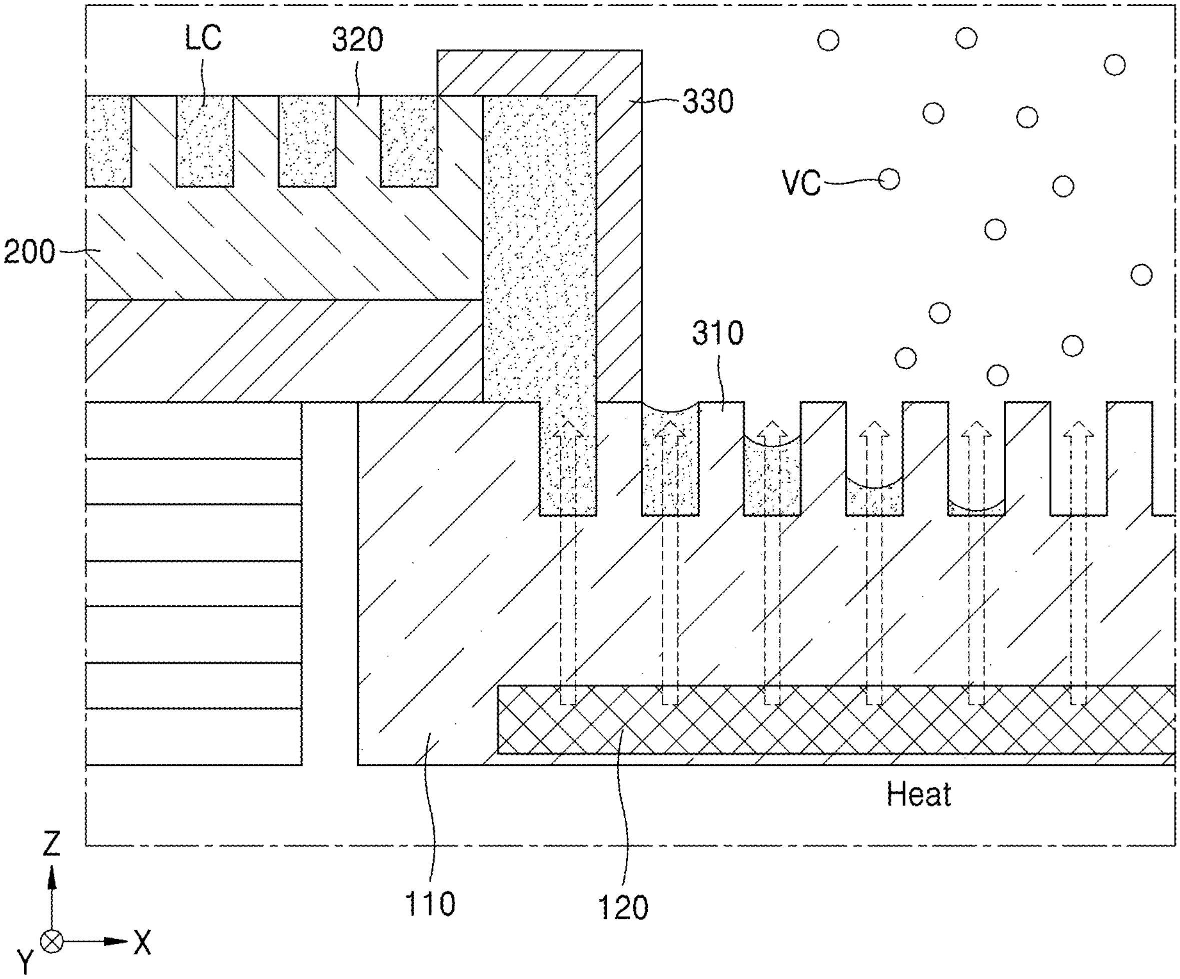
FIG. 2 is an enlarged view illustrating region A of FIG. 1.
Figure 3:
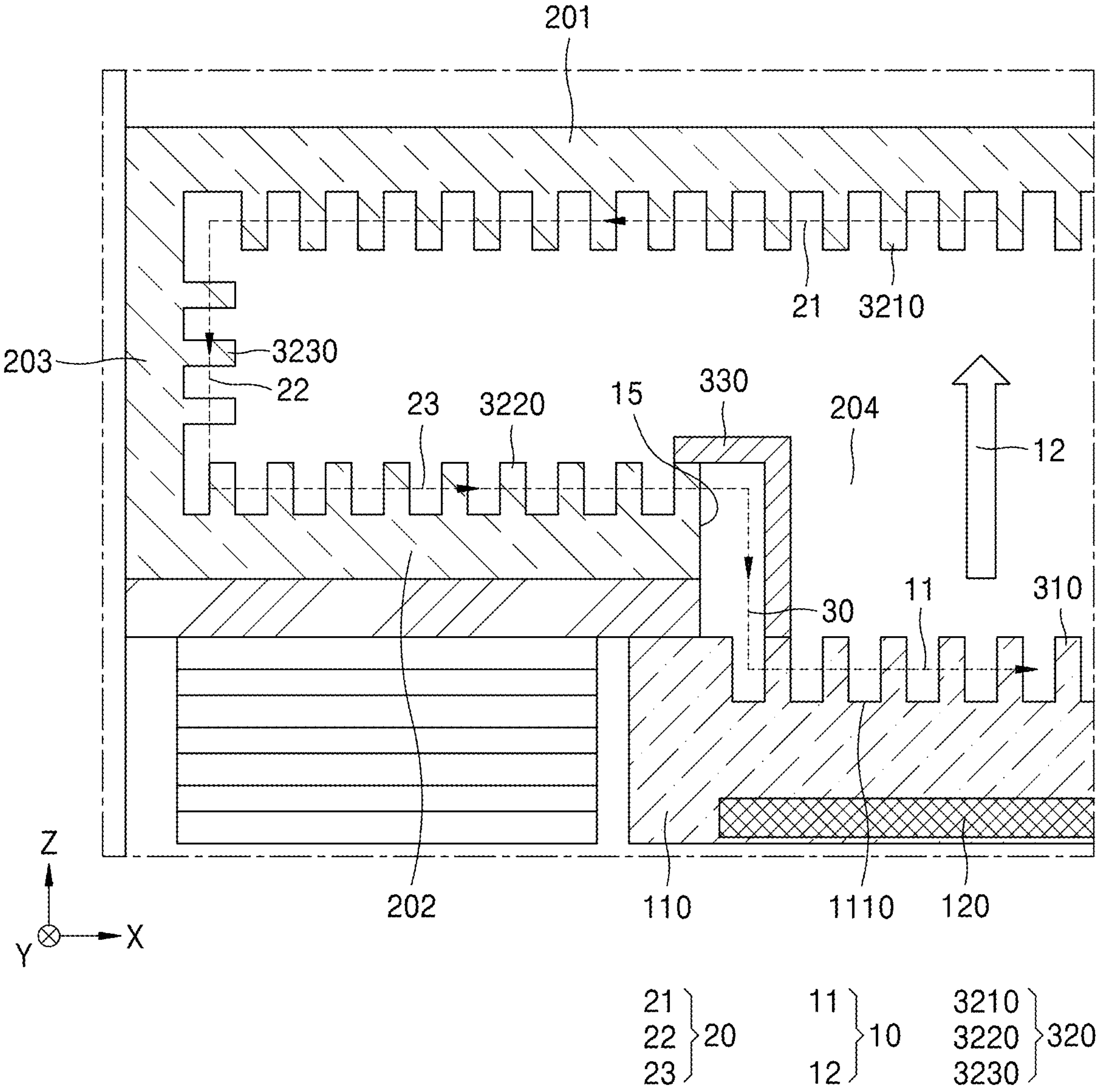
FIG. 3 is a partial view schematically illustrating a configuration of a semiconductor device according to an embodiment.

FIG. 1 is a view schematically illustrating a configuration of a semiconductor device 1 according to an embodiment. FIG. 2 is an enlarged view illustrating region A of FIG. 1. FIG. 3 is a partial view schematically illustrating a configuration of the semiconductor device 1 according to an embodiment.

Referring to FIGS. 1 to 3, according to an embodiment, the semiconductor device 1 may include a semiconductor chip 100, a cooling channel 10, a vapor chamber 200 for dissipating heat generated from the semiconductor chip 100, a package housing 700, and a printed circuit board 1000. The semiconductor chip 100 may include a substrate 110 and a semiconductor integrated circuit 120 formed on a surface of the substrate 110. Examples of the semiconductor chip 100 may include various semiconductor integrated circuit chips. For example, the semiconductor chip 100 may include a memory chip including a memory integrated circuit or a logic chip including a logic integrated circuit, a central processing unit (CPU) chip, a graphics processing unit (GPU) chip, or an application specific integrated circuit (ASIC) chip. When the semiconductor chip 100 is a wafer-level semiconductor integrated circuit chip, the semiconductor device 1 may have small form factors.

The substrate 110 may be a wafer. The semiconductor chip 100 may be mounted on the printed circuit board 1000 using, for example, solder balls S. A wiring layer may be provided on a lower surface of the semiconductor chip 100 to electrically connect the semiconductor integrated circuit 120 and the printed circuit board 1000 to each other. The wiring layer may be electrically passivated with respect to the outside. The semiconductor chip 100 may be referred to as an integrated circuit die, and the semiconductor device 1 including the integrated circuit die may be referred to as an integrated circuit device.

The cooling channel 10 may be provided in a region of the semiconductor chip 100 to absorb heat generated when the semiconductor chip 100 operates. According to an embodiment, at least a portion of the cooling channel 10 may be formed inside the semiconductor chip 100, for example, inside the substrate 110. In other words, as a whole, the cooling channel 10 may be provided in the semiconductor chip 100. For example, the cooling channel 10 may be recessed in the substrate 110 from an upper surface 112 of the substrate 110.

According to an embodiment, the cooling channel 10 may include a liquid coolant passage 11 (also referred to as a "liquid channel region") through which liquid coolant LC flows, and a vapor coolant passage 12 (also referred to as a "vapor channel region") through which vapor coolant VC flows. The liquid coolant passage 11 may be provided in the semiconductor chip 100. For example, the liquid coolant passage 11 may be recessed in the substrate 110 from the upper surface 112 of the substrate 110. In addition, the vapor coolant passage 12 may communicate with the vapor chamber 200 (described later). Accordingly, a two-phase liquid cooling system may be implemented.

In the semiconductor device 1 of the embodiment, the cooling channel 10, which includes the liquid coolant passage 11 in which liquid coolant LC flows and the vapor coolant passage 12 communicating with the liquid coolant passage 11 and in which vapor coolant VC flows, is formed in the semiconductor chip 100. That is, a cross-sectional region of the cooling channel 10 may include the liquid coolant passage 11 and the vapor coolant passage 12. Liquid coolant LC may flow along the liquid coolant passage 11 to dissipate heat generated from the semiconductor chip 100.

First wick structures 310 may move the liquid coolant LC contained in the cooling channel 10 in one direction by capillary action. For example, the first wick structures 310 are arranged on a bottom of the cooling channel 10 that is parallel to the upper surface 112 of the semiconductor chip 100 in a transverse direction (direction X). For example, the first wick structures 310 may be arranged on a bottom 1110 of the liquid coolant passage 11. Therefore, liquid coolant LC introduced into the liquid coolant passage 11 may flow in the transverse direction (direction X) parallel to the upper surface 112 of the semiconductor chip 100.

According to an embodiment, the first wick structures 310 may be formed on the semiconductor chip 100, for example, on the substrate 110 of the semiconductor chip 100. The substrate 110 is a wafer on which the semiconductor integrated circuit 120 is formed through a semiconductor process. The semiconductor integrated circuit 120 may be formed on a surface (e.g., a lower surface or active surface) of the substrate 110 through a semiconductor process, and then, the cooling channel 10 may be formed by recessing the other surface (e.g., the upper surface 112 or inactive surface) of the substrate 110 through a semiconductor process such as an etching process.

According to an embodiment, the first wick structures 310 may be formed on at least a portion of a wall surface of the cooling channel 10 through a semiconductor process such as an etching process or a laser ablation process. Therefore, the first wick structures 310 may be formed in one piece with the substrate 110. For example, when the first wick structures 310 are formed in one piece with the substrate 110, the first wick structures 310 and the substrate 110 may include the same material, such as silicon.

As described above, the first wick structures 310 may be formed during a manufacturing process of the semiconductor chip 100, and thus, the semiconductor device 1 having a cooling structure may be easily manufactured. However, embodiments are not limited thereto, and the first wick structures 310 may be formed separately from the substrate 110 and then attached to the substrate 110. Example shapes of the first wick structures 310 are described below.

According to an embodiment, liquid coolant LC contained in the cooling channel 10 may flow along the liquid coolant passage 11 due to a capillary force generated by the first wick structures 310. The liquid coolant LC contained in the liquid coolant passage 11 may absorb heat from a heat source of the semiconductor chip 100 (e.g., the semiconductor integrated circuit 120 of the semiconductor chip 100) and may vaporize such as to become vapor coolant VC. The vapor coolant VC may move from the liquid coolant passage 11 to the vapor coolant passage 12. A space of the liquid coolant passage 11, from which the vapor coolant VC escapes, is filled with liquid coolant LC by capillary force. The vapor coolant VC moves into the vapor chamber 200 along the vapor coolant passage 12. The vapor coolant VC may be changed into liquid coolant LC in the vapor chamber 200 and may then be supplied back to the liquid coolant passage 11.

Due to this configuration, liquid coolant LC may be supplied to a location close to the heat source inside the semiconductor chip 100, and thus, the semiconductor chip 100 may be effectively cooled. When liquid coolant LC vaporizes such as to become vapor coolant VC near the heat source, the vapor coolant VC may escape into the vapor coolant passage 12. A space of the liquid coolant passage 11, from which the vapor coolant VC has escaped, is quickly filled with liquid coolant LC introduced from a surrounding region due to a capillary action by the first wick structures 310.

Vapor coolant VC introduced into the vapor coolant passage 12 may flow to the vapor chamber 200. Therefore, because liquid coolant LC is quickly and continuously supplied to the periphery of the heat source, thermal resistance may be reduced near the heat source. In other words, the formation of a vapor film on surfaces of the cooling channels 10 near the heat source may be reduced or eliminated, thereby uniformly maintaining cooling performance, suppressing the formation of hot spots, and effectively dissipating heat.

In addition, liquid coolant LC may be moved by capillary force generated by the first wick structures 310. Therefore, a pump or the like for moving liquid coolant LC may be omitted, and thus, the energy consumption of a system may be reduced. In addition, the area of a heat transfer surface is increased by the first wick structures 310, and thus, the efficiency of heat transfer from the semiconductor chip 100 to coolant may be improved. In addition, bubbles of vapor coolant VC may be effectively removed from the heat transfer surface, thereby improving CHF performance. In addition, because liquid coolant LC is moved by capillary force, the posture of the semiconductor chip 100 is not affected. That is, even when the semiconductor device 1 (e.g., integrated circuit device) shown in FIG. 1 is applied to an electronic device in an upright or inverted state, the liquid coolant passage 11 and the vapor coolant passage 12 remain intact, such that liquid coolant LC may move along the liquid coolant passage 11, and vapor coolant VC may move along the vapor coolant passage 12.

The vapor chamber 200 may discharge heat generated from the semiconductor chip 100 to the outside of the semiconductor device 1. According to an embodiment, the vapor chamber 200 may be structured such that at least a portion of the vapor chamber 200 may be adjacent to a surface of the semiconductor chip 100. For example, the vapor chamber 200 may be disposed on an upper portion of the semiconductor chip 100 and may be in fluid communication with the cooling channel 10. In other words, at least a portion of the vapor chamber 200 may overlap the cooling channel 10 when viewed in a designated direction (e.g., when viewed from above).

According to an embodiment, the vapor chamber 200 may include an upper plate 201 facing the cooling channel 10, a lower plate 202 facing the upper plate 201, and a side plate 203. The side plate 203 may be disposed between the upper plate 201 and the lower plate 202. According to an embodiment, the lower plate 202 may include an opening 204 in a region corresponding to the cooling channel 10, and the opening 204 may be in fluid communication with the vapor coolant passage 12. Therefore, vapor coolant VC may move to the vapor chamber 200 along the vapor coolant passage 12.

In an embodiment, the vapor chamber 200 may include a metallic material having high processability for a mechanically process (e.g., stamping, pressing, or beading). For example, the vapor chamber 200 may include at least one selected from among a copper alloy, a low-carbon stainless steel (e.g., stainless 304L or 316L), and a titanium alloy. According to an embodiment, when the vapor chamber 200 includes the upper plate 201, the lower plate 202, and the side plate 203, the upper plate 201, lower plate 202, and side plate 203 may be manufactured through a mechanical process (e.g., a stamping process, a pressing process, or a beading process). For example, when the upper plate 201, the lower plate 202, and the side plate 203 include a copper alloy, a plate material having a predetermined thickness may be used to form the upper plate 201, the lower plate 202, and the side plate 203. When the upper plate 201, the lower plate 202 and the side plate 203 include a stainless steel material or a titanium alloy material, a plate material having a predetermined thickness may be used to form the upper plate 201, the lower plate 202, and the side plate 203. However, embodiments are not limited thereto, and the vapor chamber 200 may have any shape capable of exchanging heat with the outside and may include any material.

As described above, the vapor chamber 200 includes the upper plate 201, the lower plate 202, and the side plate 203, and the cooling channel 10 is disposed in a region corresponding to the opening 204 of the lower plate 202. Thus, a sealed space may be formed along the vapor chamber 200 and the cooling channel 10. However, embodiments are not limited thereto, and the vapor chamber 200 may have any shape capable of forming a sealed space together with the cooling channel 10.

According to an embodiment, the vapor chamber 200 may cause a phase change in vapor coolant VC moving along the vapor coolant passage 12 such that the vapor coolant VC may change into liquid coolant LC. For example, liquid coolant LC moving along the liquid coolant passage 11 may absorb heat generated from the semiconductor chip 100 and may thus change into vapor coolant VC. Then, the vapor coolant VC may move along the vapor coolant passage 12 into the vapor chamber 200.

Vapor coolant VC introduced into the vapor chamber 200 along the vapor coolant passage 12 may discharge absorbed heat to the outside of the vapor chamber 200 while flowing in the vapor chamber 200, thereby changing into liquid coolant LC. The liquid coolant LC that has undergone a phase change in the vapor chamber 200 may be moved transversely along an inner surface of the vapor chamber 200 due to second wick structures 320 arranged along the inner surface of the vapor chamber 200.

The second wick structures 320 may move the liquid coolant LC in the vapor chamber 200 in one direction by capillary action. The second wick structures 320 may be arranged along the inner surface of the vapor chamber 200. In an embodiment, the second wick structures 320 may be formed directly on the inner surface of the vapor chamber 200, or may be formed separate from the vapor chamber 200 and then coupled to the vapor chamber 200. For example, the second wick structures 320 may have a screen mesh shape, a woven wire shape, or a chemically-formed porous shape (e.g., a laminate of metal powder). According to an embodiment, the second wick structures 320 may be formed in one piece with the vapor chamber 200 by using the same material as a material of the vapor chamber 200, or may be formed separately from the vapor chamber 200 by using a material that is different from a material of the vapor chamber 200. For example, the second wick structures 320 may include copper.

According to an embodiment, when the vapor chamber 200 includes the upper plate 201, the lower plate 202, and the side plate 203, the second wick structures 320 may include 2nd-1 wick structures 3210 arranged on the upper plate 201, 2nd-2 wick structures 3220 arranged on the lower plate 202, and 2nd-3 wick structures 3230 arranged on the side plate 203. In this case, the 2nd-1 wick structures 3210 may face the first wick structures 310. In addition, the 2nd-2 wick structures 3220 may face the 2nd-1 wick structures 3210. In this case, the 2nd-3 wick structures 3230 may be arranged between the 2nd-1 wick structures 3210 and the 2nd-2 wick structures 3220.

As described above, vapor coolant VC introduced into the vapor chamber 200 along the vapor coolant passage 12 may discharge absorbed heat to the outside while flowing in the vapor chamber 200 and may thus change into liquid coolant LC. For example, vapor coolant VC introduced into the vapor chamber 200 along the vapor coolant passage 12 may discharge heat by making contact with the upper plate 201 and may thus change into liquid coolant LC. After the phase change, the liquid coolant LC may flow along a coolant flow path 20 and enter the cooling channel 10.

According to an embodiment, the coolant flow path 20 may be formed in the transverse direction along the inner surface of the vapor chamber 200 by the second wick structures 320. For example, a first coolant flow path 21 may be formed in the transverse direction (e.g., the direction X) along an inner surface of the upper plate 201 by the 2nd-1 wick structures 3210 arranged on the upper plate 201. In addition, a second coolant flow path 22 may be formed in a vertical direction (e.g., a direction Z) along an inner surface of the side plate 203 by the 2nd-3 wick structures 3230 arranged on the side plate 203. In addition, a third coolant flow path 23 may be formed in the transverse direction (e.g., the direction X) along an inner surface of the lower plate 202 by the 2nd-2 wick structures 3220 arranged on the lower plate 202. Therefore, the coolant flow path 20 may include the first coolant flow path 21, the second coolant flow path 22, and the third coolant flow path 23. Therefore, liquid coolant LC formed through a phase change may flow along the first coolant flow path 21, the second coolant flow path 22, and the third coolant flow path 23 and may then enter the cooling channel 10.

In an embodiment, the first wick structures 310 arranged on the bottom of the cooling channel 10 and the second wick structures 320 arranged on the inner surface of the vapor chamber 200 may include different materials from each other. For example, the first wick structures 310 arranged on the cooling channel 10 may be formed in one piece with the substrate 110 of the semiconductor chip 100 and may include the same material as a material of the substrate 110, for example, silicon. In this case, the second wick structures 320 may include the same material as a material of the vapor chamber 200, for example, a metallic material such as copper for heat exchange with the outside.

As described above, the second wick structures 320 arranged along the coolant flow path 20 may include a material that is different from a material included in the first wick structures 310 arranged along the cooling channel 10, and a step 15 may be formed between the vapor chamber 200 in which the coolant flow path 20 is provided and the upper surface 112 of the semiconductor chip 100 in which the cooling channel 10 is provided. Thus, third wick structures 330 may be arranged between the first wick structures 310 and the second wick structures 320 to allow liquid coolant LC flowing along the coolant flow path 20 to move to the cooling channel 10.

Due to the third wick structures 330, liquid coolant LC flowing along the coolant flow path 20 may move from the second wick structures 320 to the first wick structures 310 by capillary action. According to an embodiment, the third wick structures 330 may have a conductive wire shape extending in one direction. In this case, the third wick structures 330 may include a metallic material such as copper.

The third wick structures 330 may be arranged between the first wick structures 310 and the second wick structures 320 to connect the first wick structures 310 and the second wick structures 320 to each other. Therefore, liquid coolant LC moved to the coolant flow path 20 by the second wick structures 320 may be transferred to the cooling channel 10, including the first wick structures 310, along a coolant connection channel 30 formed by the third wick structures 330. Example shapes of the third wick structures 330 are described below.

The package housing 700 may house the semiconductor chip 100 and semiconductor chips 900. The package housing 700 may at least partially surround the semiconductor chip 100. For example, the package housing 700 may entirely surround the semiconductor chip 100 except for the upper surface 112 of the semiconductor chip 100. Because the package housing 700 may entirely surround the semiconductor chip 100 except for the upper surface 112 of the semiconductor chip 100, coolant vaporizing into vapor coolant VC by absorbing heat of the semiconductor chip 100 may be discharged to the vapor chamber 200 disposed on an upper portion of the package housing 700.

According to an embodiment, the semiconductor device 1 may further include the semiconductor chips 900 that are two-dimensionally arranged with respect to the semiconductor chip 100. For example, the semiconductor chips 900 may be arranged on both sides of the semiconductor chip 100 in a first direction X. According to embodiments, the semiconductor chips 900 may be arranged on both sides of the semiconductor chip 100 in a third direction Y. According to embodiments, the semiconductor chip 100 may be a logic chip, and the semiconductor chips 900 may be memory chips. For example, the semiconductor chips 900 may be high bandwidth memory (HBM) chips. The semiconductor chips 900 may include a plurality of HBM chips stacked in the vertical direction (direction Z).

According to an embodiment, the semiconductor chips 900 may be arranged under the vapor chamber 200, for example, under the 2nd-2 wick structures 3220. According to embodiments, a heat dissipation plate 710 may be arranged between the semiconductor chips 900 and the vapor chamber 200. The heat dissipation plate 710 may be in contact with the semiconductor chips 900 and may be thermally connected to the vapor chamber 200. For example, the heat dissipation plate 710 may include a thermal interface material (TIM) or a graphite sheet. However, embodiments are not limited thereto.

Figure 4:
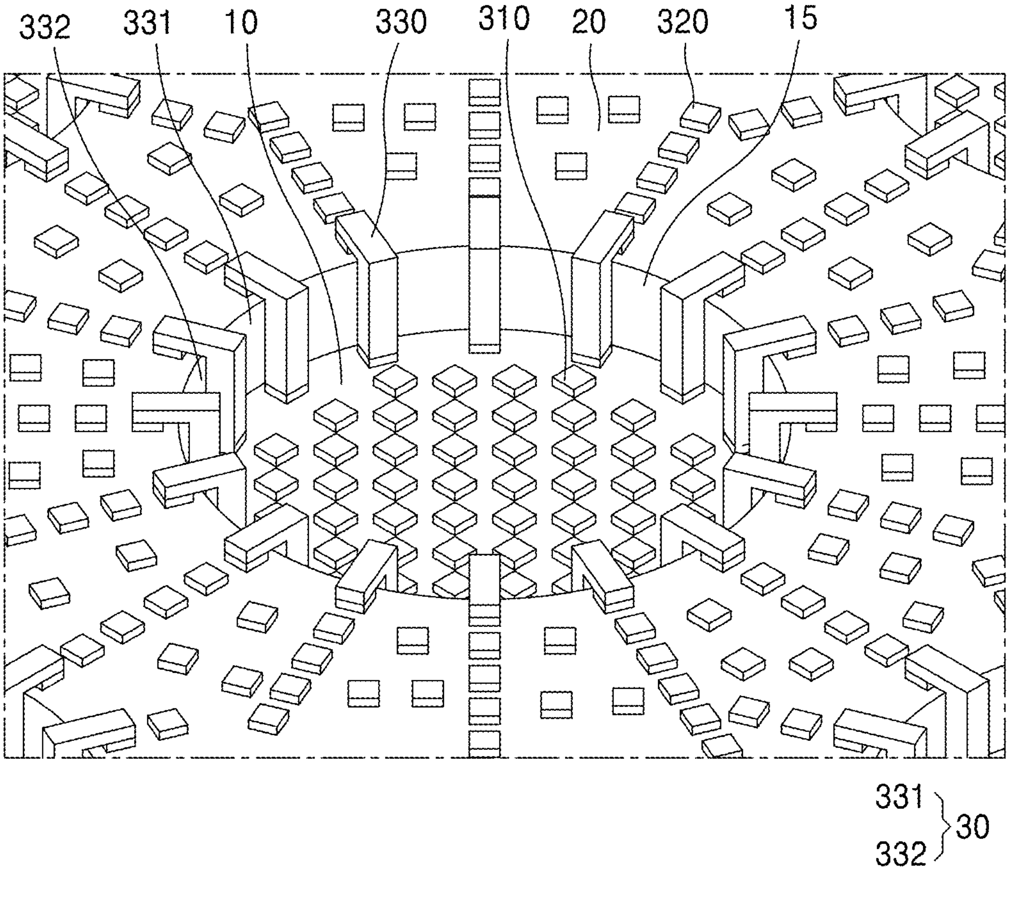
FIG. 4 is a partial perspective view schematically illustrating a configuration of a semiconductor device according to an embodiment.
Figure 5:
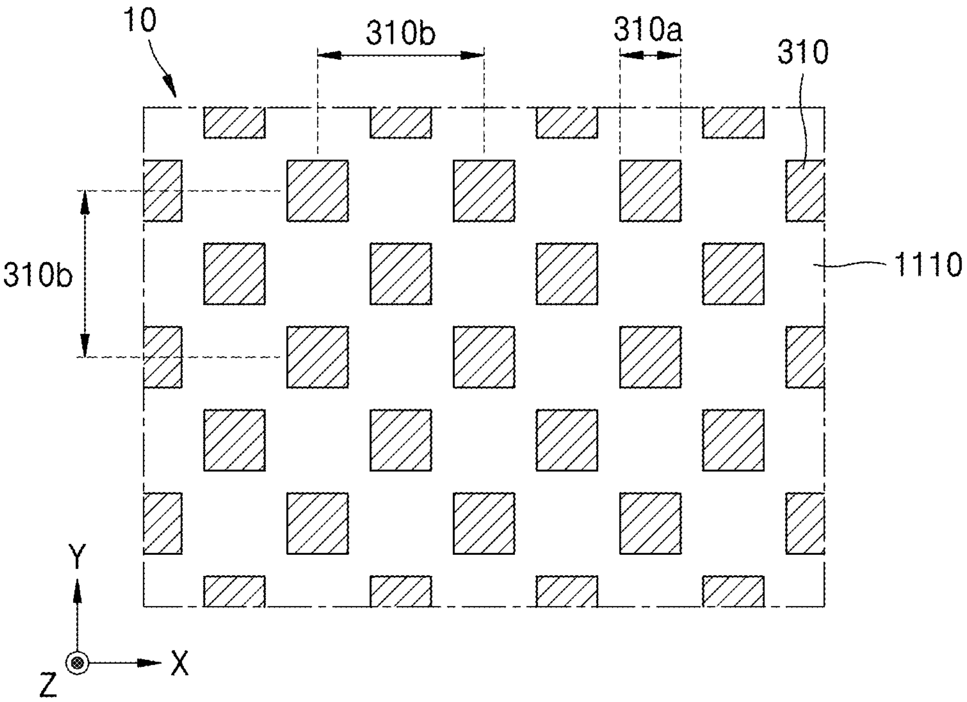
FIG. 5 is a plan view schematically illustrating a cooling channel and first wick structures according to an embodiment.

FIG. 4 is a partial perspective view schematically illustrating a configuration of the semiconductor device 1 according to an embodiment. FIG. 5 is a plan view schematically illustrating the cooling channel 10 and the first wick structures 310 according to an embodiment.

Referring to FIG. 3, as described above, vapor coolant VC moving into the vapor chamber 200 along the vapor coolant passage 12 may change into liquid coolant LC inside the vapor chamber 200. Liquid coolant LC formed through a phase change may be moved to the coolant flow path 20 by the second wick structures 320. In addition, liquid coolant LC introduced into the cooling channel 10 may be moved to the coolant flow path 20 by the second wick structures 320.

According to an embodiment, capillary force by the first wick structures 310 and the second wick structures 320 may be defined by Equation 1 below. In Equation 1, $\Delta P_c$ refers to a capillary force, σ refers to a surface tension, and $r_c$ refers to a capillary radius.

$$\Delta P_c = 2\frac{\sigma}{r_c} \quad \text{(Equation 1)}$$

At a capillary limit, the capillary force is equivalent to $\Delta P_L$ that is a pressure for moving a coolant through a wick. According to Darcy's law, $\Delta P_L$ may be calculated by Equation 2 below. In Equation 2, UL refers to a dynamic viscosity of the coolant, $L_{eff}$ refers to an effective length of a pipe, K refers to a permeability of the wick, $A_w$ refers to a cross-sectional area of the wick, and V refers to a volume flow rate.

$$\Delta P_L = \frac{\mu_L L_{eff}}{K A_w} V \quad \text{(Equation 2)}$$

Here, the volume flow rate V may be calculated by Equation 3 below. In Equation 3, Q refers to a heat transfer rate, p refers to a density of the coolant, and $\Delta H_{vap}$ refers to latent heat of vaporization.

$$V = \frac{Q}{\Delta H_{vap} \rho} \quad \text{(Equation 3)}$$

Equation 4 below may be derived from Equations 1, 2, and 3.

$$Q = 2\frac{K A_w \Delta H_{vap} \rho \sigma}{\mu_L L_{eff} r_c} \quad \text{Equation 4}$$

An appropriate capillary radius $r_c$ may be calculated using Equation 4 by considering the amount of heart generated by the semiconductor chip 100. Form factors of the first wick structures 310 and a capillary distance may be determined based on the calculated capillary radius $r_c$.

Referring to FIGS. 4 and 5, in an embodiment, the first wick structures 310 may have a square cross-sectional shape in the transverse direction. The first wick structures 310 may be arranged at equal intervals in the first direction X and the third direction Y. Liquid coolant LC is moved by capillary force into a space (first transverse capillary channel) between adjacent ones of the first wick structures 310. A height of each of the first wick structures 310, a length 310*a* of each side of the first wick structures 310, and a distance 310*b* between the first wick structures 310 in the first direction X and the third direction Y may be determined such that the radius of an equivalent circle corresponding to the cross-sectional area of a space (first transverse capillary channel) between two adjacent ones of the first wick structures 310 may satisfy a capillary radius re calculated using Equations 1 to 4. The second wick structures 320 arranged along the coolant flow path 20 may be substantially the same as the first wick structures 310, and thus, repeated description thereof is omitted here.

Figure 6:
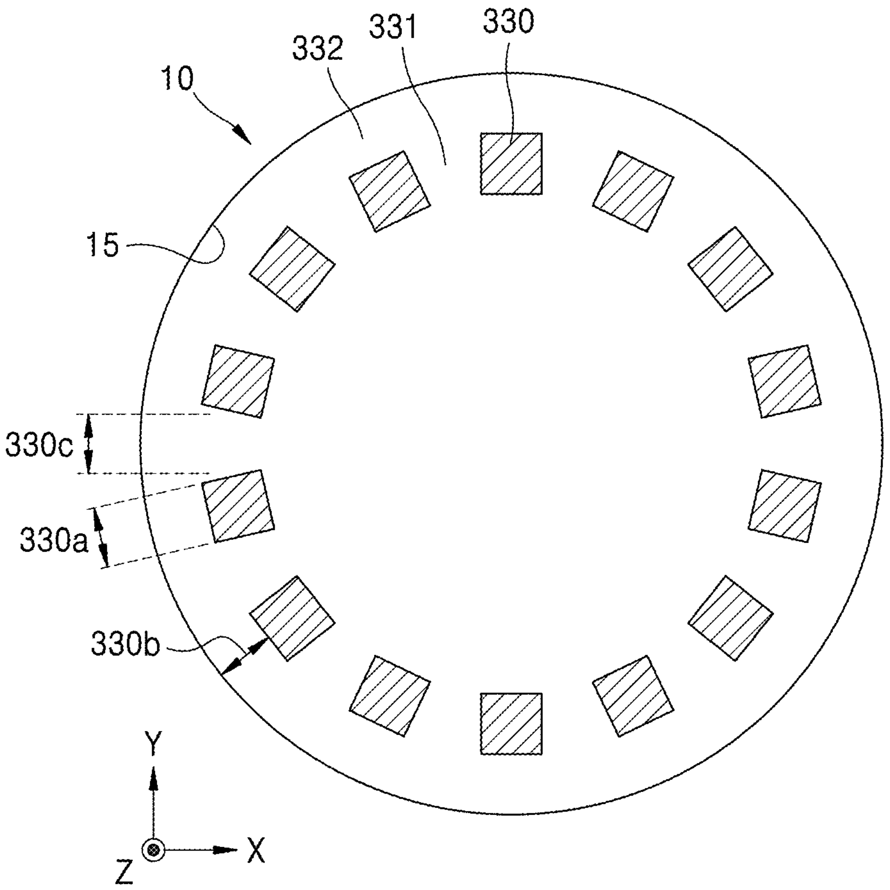
FIG. 6 is a cross-sectional view schematically illustrating a cooling channel and third wick structures according to an embodiment.

FIG. 6 is a cross-sectional view schematically illustrating the cooling channel 10 and the third wick structures 330 according to an embodiment.

For ease of illustration, the size of the third wick structures 330 is exaggerated in FIG. 6. In FIG. 6, the first wick structures 310 and the second wick structures 320 are omitted. Referring to FIGS. 4 and 6, for example, the planar shape of the cooling channel 10 may be circular. However, embodiments are not limited thereto, and the planar shape of the cooling channel 10 may be a polygonal shape such as a square shape, a circular shape, or a triangular shape.

The third wick structures 330 may be spaced apart from the step 15 formed between the vapor chamber 200 and the upper surface 112 of the semiconductor chip 100 shown in FIG. 3 by a capillary distance in a direction toward the inside of the cooling channel 10. In an embodiment, the cross-sectional shape of the third wick structures 330 in the transverse direction may be square. However, embodiments are not limited thereto. The third wick structures 330 may extend in the vertical direction (direction Z) from upper surfaces of first wick structures 310 that are closest to the step 15 among the first wick structures 310. The third wick structures 330 may extend in the vertical direction (direction Z) from the upper surfaces of first wick structures 310 that are closest to the step 15 among the first wick structures 310, and may further extend toward upper surfaces of the second wick structures 320 along a plane (XY plane) perpendicular to the vertical direction (direction Z). Therefore, the third wick structures 330 may be arranged between first wick structures 310 and second wick structures 320 that are closest to the step 15 to connect the first wick structures 310 and the second wick structures 320 to each other.

According to an embodiment, the third wick structures 330 are spaced apart from the step 15, wherein the step has a circular shape and is formed between the vapor chamber 200 and the upper surface 112 of the semiconductor chip 100. For example, the third wick structures 330 are spaced apart from each other at intervals in a circumferential direction. Each of first vertical capillary channels 331 is formed between third wick structures 330 arranged adjacent to each other among the third wick structures 330, and each of second vertical capillary channels 332 is formed between each of the third wick structures 330 and the step 15. In an embodiment, the coolant connection channel 30 shown in FIG. 3 may include the first vertical capillary channels 331 and the second vertical capillary channels 332.

A length 330*a* of a side of each of the third wick structures 330 and a separation distance 330*b* of the third wick structures 330 from the step 15 may be determined by a capillary distance enabling the occurrence of capillary force in the second vertical capillary channels 332. In other words, the cross-sectional area of each of the second vertical capillary channels 332 is defined by the length 330*a* of a side of each of the third wick structures 330 and the separation distance 330*b* of the third wick structures 330 from the step 15. The length 330*a* of a side of each of the third wick structures 330 and the separation distance 330*b* of the third wick structures 330 from the step 15 may be determined such that the radius of an equivalent circle corresponding to the cross-sectional area of each of the second vertical capillary channels 332 may satisfy a capillary radius $r_c$ calculated using Equations 1 to 4. For example, when the transversal cross-sectional shape of the third wick structures 330 is a square shape, the separation distance 330*b* of the third wick structures 330 from the step 15 of the third wick structures 330 may be twice the capillary radius $r_c$.

The length 330*a* of a side of each of the third wick structures 330 and a distance 330*c* between the third wick structures 330 may be determined such that capillary force may be generated in the first vertical capillary channels 331. In other words, the cross-sectional area of each of the first vertical capillary channels 331 is defined by the length 330*a* of a side of each of the third wick structures 330 and the distance 330*c* between adjacent ones of the third wick structures 330. The length 330*a* of a side of each of the third wick structures 330 and the distance 330*c* between adjacent ones of the third wick structures 330 may be determined such that the radius of an equivalent circle corresponding to the cross-sectional area of each of the first vertical capillary channels 331 may satisfy a capillary radius re calculated using Equations 1 to 4.

Although the transversal cross-sectional shape of the first wick structures 310, second wick structures, and third wick structures 330 is a square shape in the embodiments described above, embodiments are not limited thereto. The transversal cross-sectional shape of the first wick structures 310, second wick structures, and third wick structures 330 may be any shape capable of generating capillary force such as various polygonal shapes including a triangular shape and a square shape, partially circular shapes, and partially elliptical shapes. In addition, the first wick structures 310, second wick structures, and third wick structures 330 are not required to have the same cross-sectional shape in the transversal direction. For example, the first wick structures 310, second wick structures, and third wick structures 330 may have two or more different cross-sectional shapes in the transverse direction.

Figure 7:
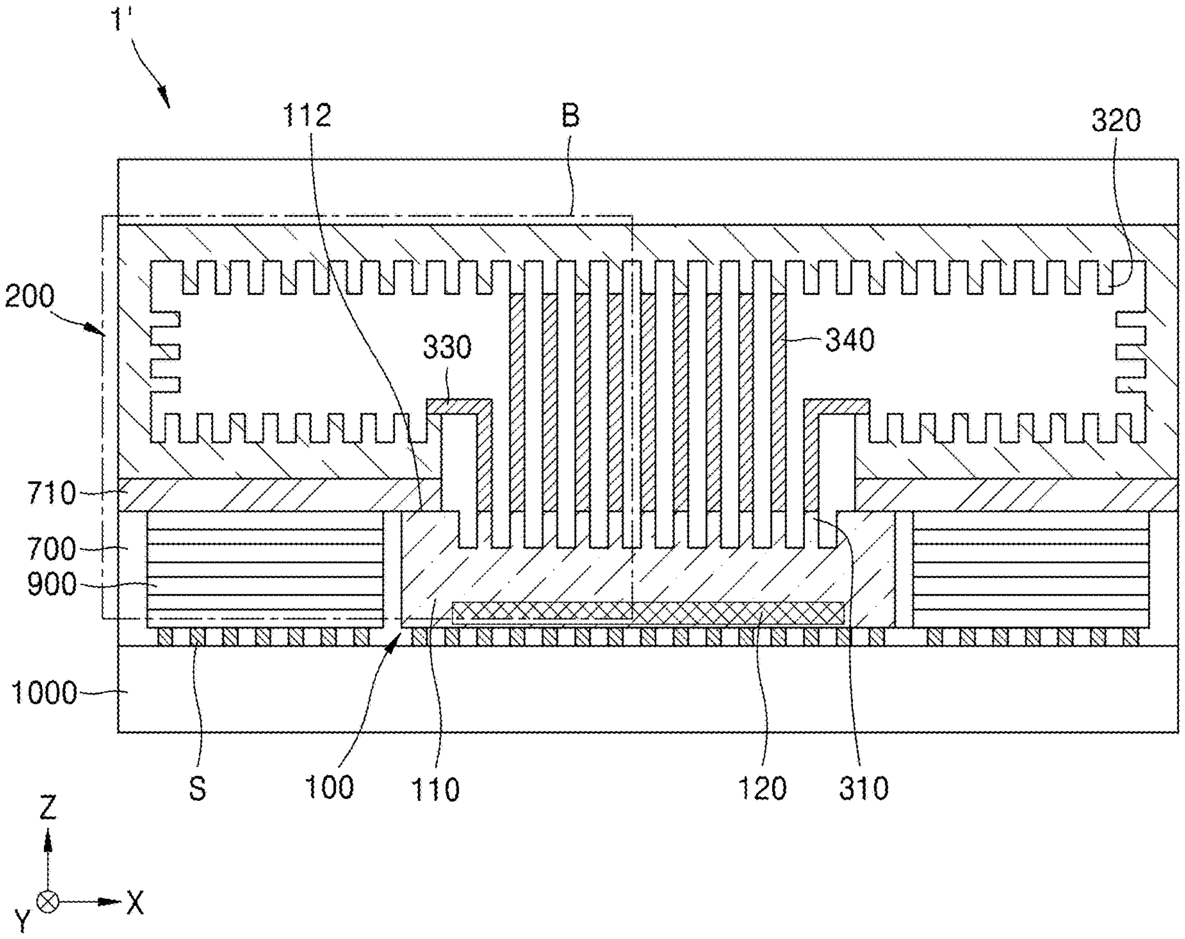
FIG. 7 is a view schematically illustrating a configuration of a semiconductor device according to an embodiment.
Figure 8:
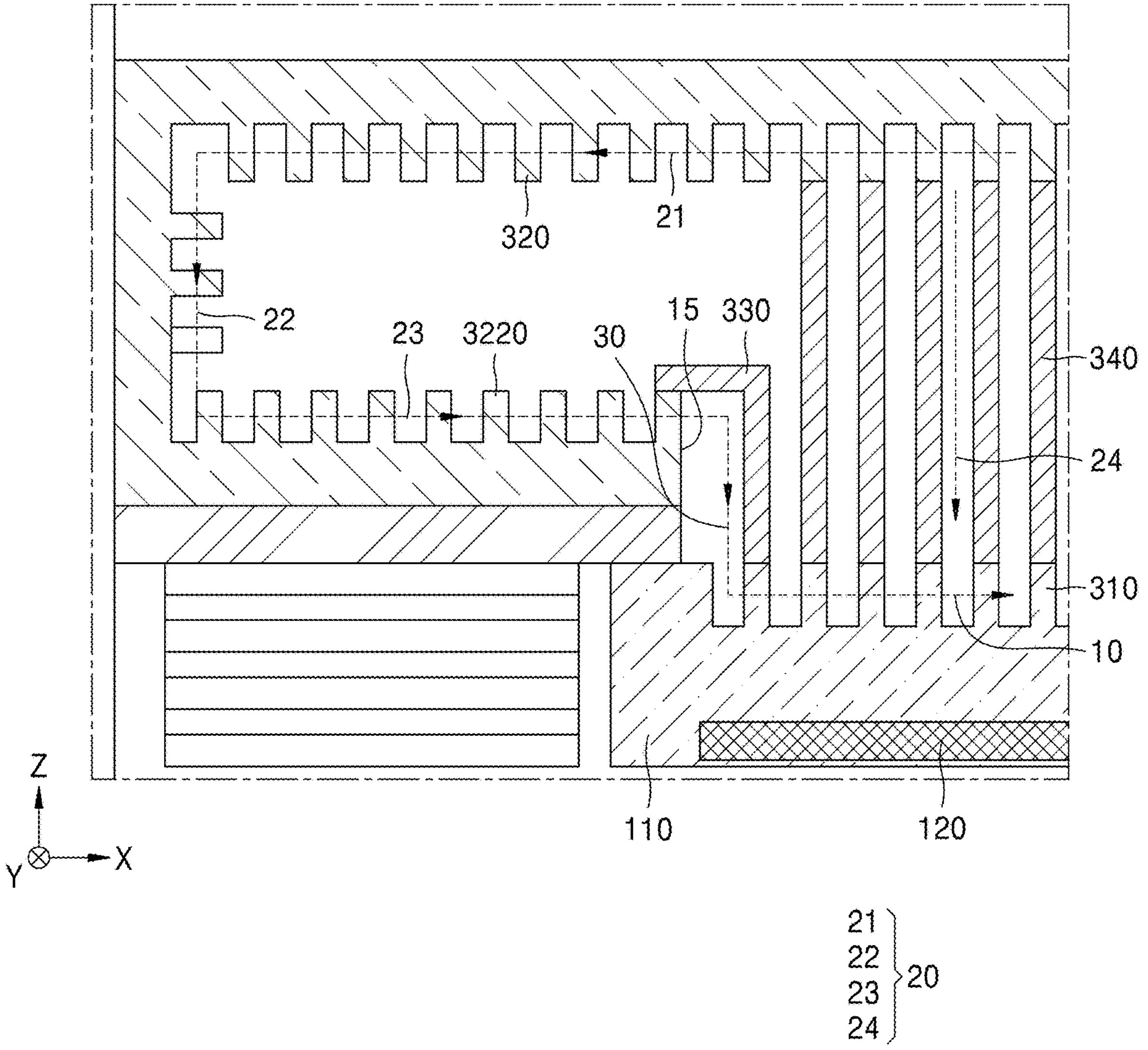
FIG. 8 is an enlarged view illustrating region B of FIG. 7.

FIG. 7 is a view schematically illustrating a configuration of a semiconductor device 1' according to an embodiment. FIG. 8 is an enlarged view illustrating region B of FIG. 7.

Referring to FIGS. 7 and 8, the semiconductor device 1' of the embodiment may include a semiconductor chip 100, a cooling channel 10, a vapor chamber 200 configured to dissipate heat generated from the semiconductor chip 100, a package housing 700, and a printed circuit board 1000. The configuration of the semiconductor device 1' is substantially the same as the configuration of the semiconductor device 1 shown in FIG. 1 except for 3rd-1 wick structures 340, and thus, repeated description of the same configuration is omitted here.

The 3rd-1 wick structures 340 may connect first wick structures 310 to second wick structures 320 facing the first wick structures 310. According to an embodiment, the 3rd-1 wick structures 340 may have a conductive wire shape extending between upper surfaces of the first wick structures 310 and upper surfaces of the second wick structures 320. For example, the 3rd-1 wick structures 340 may have a conductive wire shape extending in a vertical direction (direction Z) between the upper surfaces of the first wick structures 310 and the upper surfaces of the second wick structures 320. In an embodiment, the cross-sectional shape of the 3rd-1 wick structures 340 in a transverse direction may be a square shape. However, embodiments are not limited thereto. The cross-sectional shape of the 3rd-1 wick structures 340 in the transverse direction may be any shape capable of generating capillary force, such as various polygonal shapes including a triangular shape and a square shape, partially circular shapes, and partially elliptical shapes. In addition, the 3rd-1 wick structures 340 are not required to have the same cross-sectional shape in the transverse direction. For example, the 3rd-1 wick structures 340 may have two or more different cross-sectional shapes in the transverse direction.

A length of a side of each of the 3rd-1 wick structures 340 and a distance between the 3rd-1 wick structures 340 may be substantially the same as the length 330*a* of a side of each of the third wick structures 330 and the distance 330*c* between the third wick structures 330 that are described with reference to FIG. 6. In other words, the length of a side of each of the 3rd-1 wick structures 340 and the distance between the 3rd-1 wick structures 340 may be determined such that the radius of an equivalent circle corresponding to the cross-sectional area of each of vertical capillary channels formed between the 3rd-1 wick structures 340 may satisfy a capillary radius $r_c$ calculated using Equations 1 to 4.

According to an embodiment, the 3rd-1 wick structures 340 may connect the first wick structures 310 to the second wick structures 320 facing the first wick structures 310, thereby forming a fourth coolant flow path 24 causing liquid coolant LC to flow from the second wick structures 320 to the first wick structures 310 facing the second wick structures 320. For example, the fourth coolant flow path 24 may be formed in the vertical direction (direction Z) from the second wick structures 320 to the first wick structures 310 facing the second wick structures 320.

Figure 9:
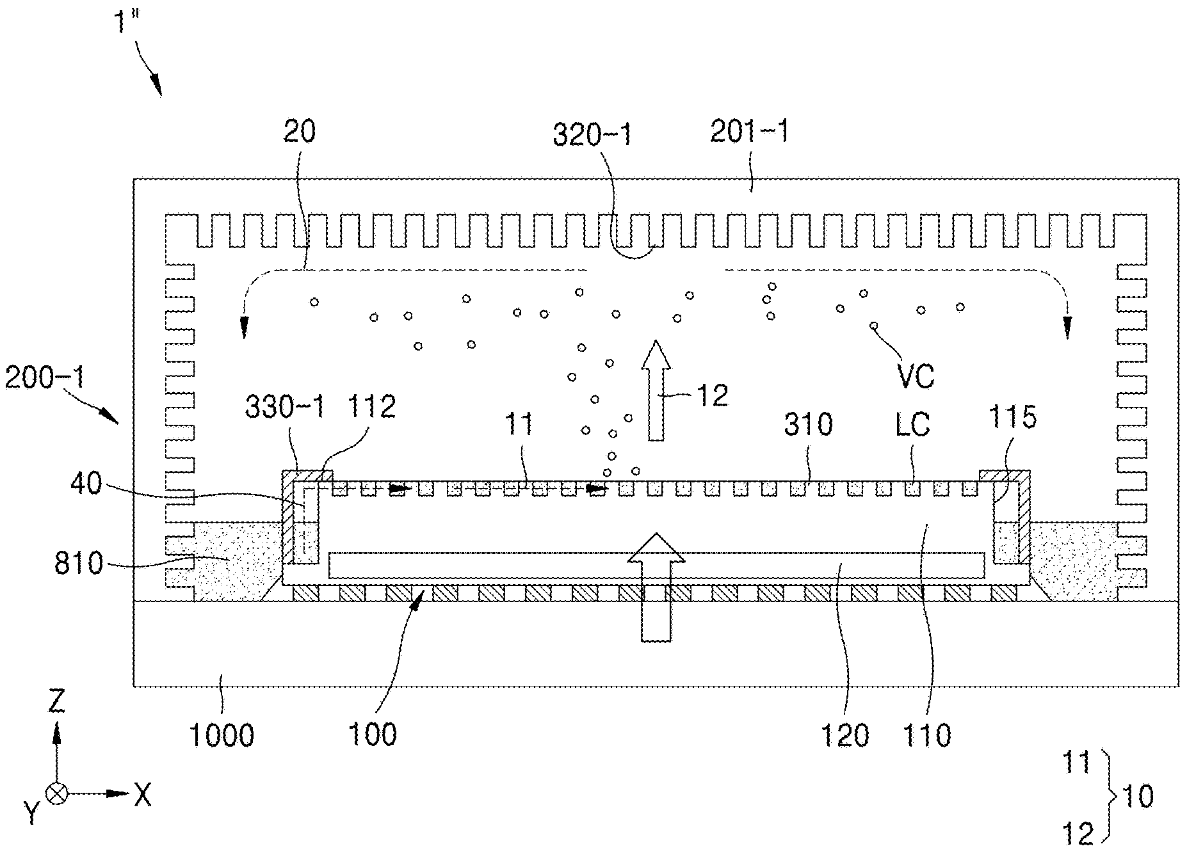
FIG. 9 is a view schematically illustrating a configuration of a semiconductor device according to an embodiment.

FIG. 9 is a view schematically illustrating a configuration of a semiconductor device 1" according to an embodiment.

Referring to FIG. 9, the semiconductor device 1" of the embodiment may include a semiconductor chip 100, a cooling channel 10, a vapor chamber 200-1 configured to dissipate heat generated from the semiconductor chip 100, and a printed circuit board 1000. The configuration of the semiconductor device 1" is substantially the same as the configuration of the semiconductor device 1 shown in FIG. 1 except for the vapor chamber 200-1, second wick structures 320-1, and third wick structures 330-1, and thus, repeated description of the same configuration is omitted here.

The vapor chamber 200-1 may dissipate heat generated from the semiconductor chip 100 to the outside of the semiconductor device 1". According to an embodiment, the vapor chamber 200-1 may be configured such that at least a portion of the vapor chamber 200-1 may be adjacent to a surface of the semiconductor chip 100. For example, the vapor chamber 200-1 may surround the semiconductor chip 100 above the printed circuit board 1000 and may be in fluid communication with the cooling channel 10. In other words, at least a portion of the vapor chamber 200-1 may overlap the cooling channel 10 when viewed in a designated direction (e.g., when viewed from above).

In an embodiment, the vapor chamber 200-1 may include a metallic material having high processability for a mechanically process (e.g., stamping, pressing, or beading). For example, the vapor chamber 200-1 may include at least one selected from among a copper alloy, a low-carbon stainless steel (e.g., stainless 304L or 316L), and a titanium alloy. However, embodiments are not limited thereto, and the vapor chamber 200-1 may have any shape capable of exchanging heat with the outside and may include any material.

As described above, the vapor chamber 200-1 surrounds the semiconductor chip 100, thereby forming a sealed space that surrounds the cooling channel 10 provided at an upper side of the semiconductor chip 100. However, embodiments are not limited thereto, and the vapor chamber 200-1 may have any shape as long as the vapor chamber 200-1 forms a sealed space surrounding the cooling channel 10.

Vapor coolant VC may move to the vapor chamber 200-1 along a vapor coolant passage 12 included in the cooling channel 10. The vapor coolant VC introduced into the vapor chamber 200-1 releases, to the outside, heat absorbed while moving in the vapor chamber 200-1, thereby changing into liquid coolant LC. For example, vapor coolant VC introduced into the vapor chamber 200-1 along the vapor coolant passage 12 may make contact with an upper plate 201-1 and release heat to the outside, thereby undergoing a phase change into liquid coolant LC. The liquid coolant LC formed through the phase change may move along a coolant flow path 20 and enter the cooling channel 10.

According to an embodiment, the coolant flow path 20 may be formed in a transverse direction along an inner surface of the vapor chamber 200-1 by the second wick structures 320-1. The coolant flow path 20 may be connected to a coolant storage portion 810 in which liquid coolant to be supplied to the cooling channel 10 is contained. In the current embodiment, the coolant storage portion 810 is provided outside the semiconductor chip 100. In this case, the height of the coolant storage portion 810 may not exceed an upper surface 112 of the semiconductor chip 100 in a vertical direction (direction Z).

The third wick structures 330-1 may be arranged between first wick structures 310 and the coolant storage portion 810 to connect the first wick structures 310 and the coolant storage portion 810 to each other. According to an embodiment, the third wick structures 330-1 may form a fourth coolant flow path 40 through which liquid coolant LC is supplied from the coolant storage portion 810 to the first wick structures 310 by capillary force. In an embodiment, the third wick structures 330-1 may be spaced apart from a side wall 115 of the semiconductor chip 100 toward the outside of the cooling channel 10 by a capillary distance. In an embodiment, the third wick structures 330-1 may extend from the coolant storage portion 810 in the vertical direction (direction Z). Therefore, the third wick structures 330-1 may be arranged between the coolant storage portion 810 and the first wick structures 310 and connect the coolant storage portion 810 and the first wick structures 310 to each other.

Figure 10:
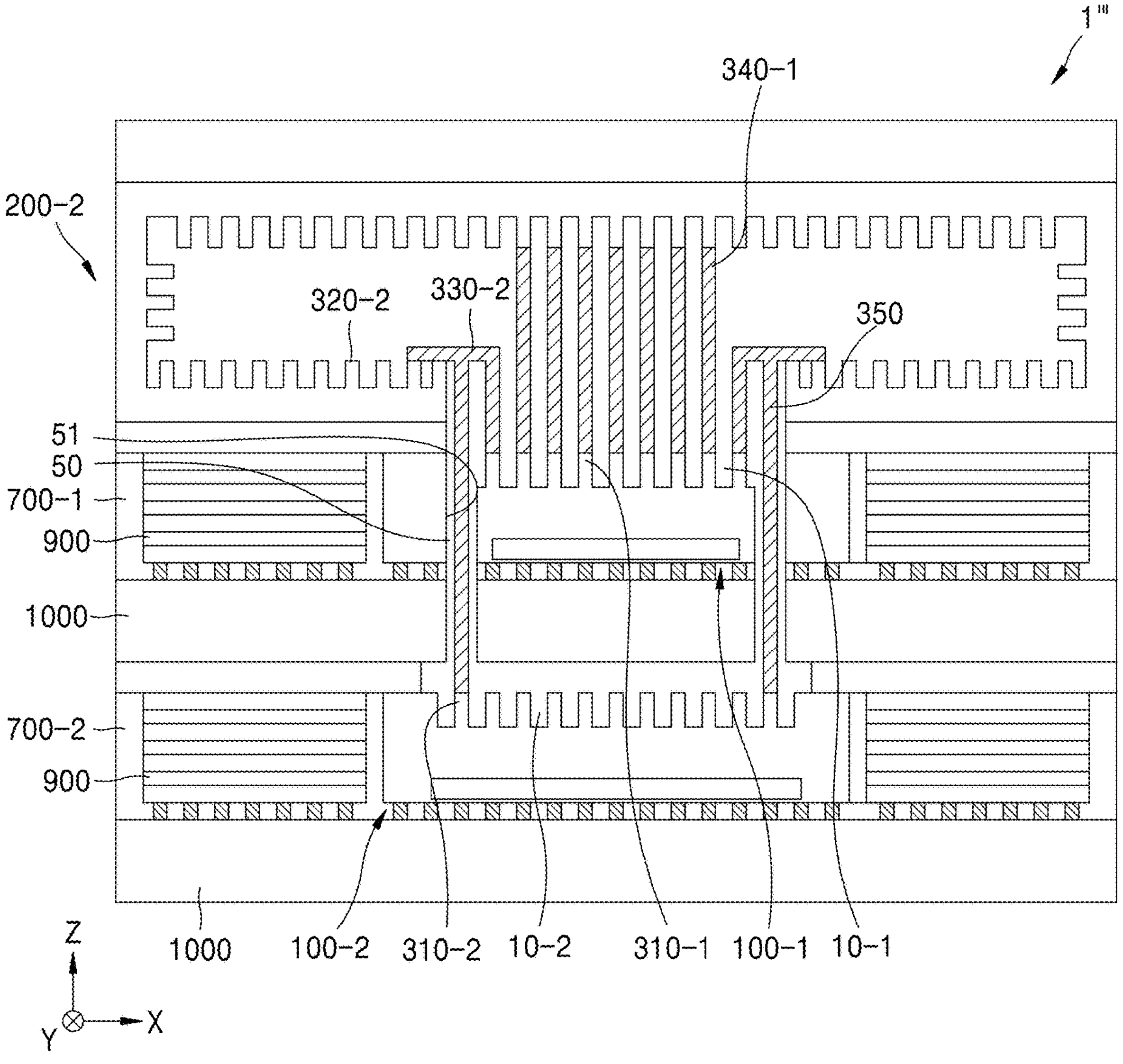
FIG. 10 is a view schematically illustrating a configuration of a semiconductor device according to an embodiment.

FIG. 10 is a view schematically illustrating a configuration of a semiconductor device 1"' according to an embodiment.

The semiconductor device 1" of the embodiment shown in FIG. 10 is different from the semiconductor device 1 of the embodiment shown in FIG. 1 in that the semiconductor device 1"' includes a plurality of semiconductor chips. Hereinafter, like reference numerals refer to elements having the same functions, and repeated description thereof is omitted.

Referring to FIG. 10, according to an embodiment, the semiconductor device 1"' may include includes a plurality of semiconductor chips such as a first semiconductor chip 100-1 and a second semiconductor chip 100-2 that are stacked in a vertical direction (direction Z). The first semiconductor chip 100-1 may be disposed above the second semiconductor chip 100-2 in the vertical direction (direction Z). A plurality of cooling channels (e.g., a cooling channel 10-1 and a cooling channel 10-2) and a plurality of first wick structures 310-1 and 310-2 may be respectively provided for the first semiconductor chip 100-1 and the second semiconductor chip 100-2. For example, the cooling channel 10-1 and the first wick structures 310-1 may be provided for the first semiconductor chip 100-1, and the cooling channel 10-2 and the first wick structures 310-2 may be provided for the second semiconductor chip 100-2. The descriptions of the cooling channel 10 and the first wick structures 310 may be applied to the cooling channels 10-1 and 10-2 and the first wick structures 310-1 and 310-2.

A vapor chamber 200-2 may be disposed on an upper side of the uppermost semiconductor chip of the plurality of semiconductor chips in the vertical direction (direction Z). For example, the vapor chamber 200-2 may be disposed on the upper side of the first semiconductor chip 100-1. Second wick structures 320-2 may be arranged along an inner surface of the vapor chamber 200-2. The descriptions of the vapor chamber 200 and the second wick structures 320 may be applied to the vapor chamber 200-2 and the second wick structures 320-2.

A plurality of package housings 700-1 and 700-2 may respectively surround the first semiconductor chip 100-1 and the second semiconductor chip 100-2. In this case, the package housings 700-1 and 700-2 may respectively surround the first semiconductor chip 100-1 and the second semiconductor chip 100-2 except for upper surfaces of the first semiconductor chip 100-1 and the second semiconductor chip 100-2. The vapor chamber 200-2 may be disposed on an upper portion of the uppermost package housing of the package housings 700-1 and 700-2 in the vertical direction (direction Z). For example, the vapor chamber 200-2 may be disposed on the upper portion of the first semiconductor chip 100-1. The description of the package housing 700 may be applied to the package housings 700-1 and 700-2.

The second semiconductor chip 100-2 has substantially the same structure as the semiconductor chip 100 of the embodiment described with reference to FIG. 1. The first semiconductor chip 100-1 is of a type in which a connection channel 50 is added to the semiconductor chip 100 of the embodiment described with reference to FIG. 1.

The connection channel 50 may penetrate all the plurality of semiconductor chips in the vertical direction (direction Z) except for the lowest semiconductor chip among the plurality of semiconductor chips. For example, when the plurality of semiconductor chips include the first semiconductor chip 100-1 and the second semiconductor chip 100-2 that are stacked in the vertical direction (direction Z), the connection channel 50 may penetrate the first semiconductor chip 100-1 in the vertical direction (direction Z) but may not penetrate the second semiconductor chip 100-2 that is lowest in the vertical direction (direction Z). In the example above, two semiconductor chips are stacked. However, embodiments are not limited thereto. When three or more semiconductor chips are stacked, the connection channel 50 may penetrate all the semiconductor chips except for the lowest semiconductor chip.

Third wick structures 330-2 may be arranged above the uppermost semiconductor chip among the plurality of semiconductor chips in the vertical direction (direction Z). For example, the third wick structures 330-2 may be arranged between the first wick structures 310-1 and second wick structures 320-1 that are arranged at an upper side of the first semiconductor chip 100-1. The description of the third wick structures 330 given with reference to FIG. 1 may be applied to the third wick structures 330-2.

3rd-1 wick structures 340-1 may be arranged above the uppermost semiconductor chip among the plurality of semiconductor chips in the vertical direction (direction Z). For example, the 3rd-1 wick structures 340-1 may be arranged between first wick structures 310-1 and the second wick structures 320-2 that face each other above the first semiconductor chip 100-1. The description of the 3rd-1 wick structures 340 given with respect to FIG. 7 may be applied to the 3rd-1 wick structures 340-1.

At least one of the third-2 wick structures 350 may be disposed in the connection channel 50 such that liquid coolant may be moved by capillary action from the second wick structures 320-2 to each of at least one of the first wick structures 310-2. For example, the at least one of the 3rd-2 wick structures 350 may be arranged between the second wick structures 320-2 and the first wick structures 310-2 arranged on the second semiconductor chip 100-2 that is uppermost among the plurality of semiconductor chips stacked in the vertical direction (direction Z). In this case, the at least one of the 3rd-2 wick structures 350 may move liquid coolant between the second wick structures 320-2 and the first wick structures 310-2 by capillary force.

According to an embodiment, the 3rd-2 wick structures 350 may have a conductive wire shape extending in one direction. In this case, the 3rd-2 wick structures 350 may include a metallic material, for example, copper.

The 3rd-2 wick structures 350 may be spaced apart from a side wall 51 of the connection channel 50 toward the inside of the cooling channel 10-2 by a capillary distance. In an embodiment, the cross-sectional shape of the 3rd-2 wick structures 350 in a transverse direction may be a square shape. However, embodiments are not limited thereto.

The 3rd-2 wick structures 350 may extend in the vertical direction (direction Z) from second wick structures 320-2 closest to the connection channel 50 to upper surfaces of the first wick structures 310-2 that are arranged on the second semiconductor chip 100-2 (the uppermost semiconductor chip). For example, the 3rd-2 wick structures 350 may extend in the vertical direction (direction Z) from the upper surfaces of the first wick structures 310-2 to upper surfaces of the second wick structures 320-2 closest to the connection channel 50, and may further extend to upper surfaces of second wick structures 320-2 along a plane (plane XY) perpendicular to the vertical direction (direction Z). Therefore, the 3rd-2 wick structures 350 may connect the first wick structures 310-2 and the second wick structures 320-2 that are closest to the connection channel 50. As a result, liquid coolant formed by a phase change in the vapor chamber 200-2 may be supplied to the cooling channels 10-1 and 10-2 that are respectively formed in the first semiconductor chip 100-1 and the second semiconductor chip 100-2 (stacked semiconductor chips).

As described above, according to one or more of the above embodiments, the semiconductor device employs a two-phase liquid cooling structure.

According to one or more of the above embodiments, the semiconductor device includes the vapor chamber having an extended heat transfer surface.

According to one or more of the above embodiments, the semiconductor device employing a two-phase liquid cooling structure may prevent a decrease in cooling efficiency caused by bubbles adsorption on a heating surface.

According to one or more of the above embodiments, the semiconductor device does not require additional power to move a cooling fluid.

It should be understood that the example embodiments described herein should be considered in a descriptive sense only and not for purposes of limitation. Descriptions of features or aspects of each example embodiment should typically be considered as available for other similar features or aspects in other embodiments. While non-limiting example embodiments have been described with reference to the figures, it will be understood by those of ordinary skill in the art that various changes in form and details may be made therein without departing from the spirit and scope of the present disclosure.

What is claimed is:

1. A semiconductor device comprising:

a semiconductor chip including a cooling channel recessed in the semiconductor chip from an upper surface of the semiconductor chip, the cooling channel configured to have a liquid coolant flow therein such as to absorb heat generated during an operation of the semiconductor chip;

first wick structures on a bottom of the cooling channel that is parallel to the upper surface of the semiconductor chip in a transverse direction, the first wick structures configured to move the liquid coolant by capillary action in the transverse direction along the bottom of the cooling channel;

a vapor chamber above the semiconductor chip and in fluid communication with the cooling channel;

second wick structures on an inner surface of the vapor chamber and configured to move the liquid coolant by capillary action in the transverse direction along the inner surface of the vapor chamber; and third wick structures between the first wick structures and the second wick structures and configured to move the liquid coolant from the second wick structures to the first wick structures by capillary action.

2. The semiconductor device of claim 1, wherein the first wick structures comprise a material that is different from a material included in the second wick structures.

3. The semiconductor device of claim 1, wherein the first wick structures comprise silicon, and the second wick structures comprise copper.

4. The semiconductor device of claim 2, wherein the third wick structures comprise copper.

5. The semiconductor device of claim 1, wherein the third wick structures connect together some of the first wick structures and some of the second wick structures that are closest to a step formed between the vapor chamber and the upper surface of the semiconductor chip, and the third wick structures are spaced apart from the step toward an inside of the cooling channel by a capillary distance.

6. The semiconductor device of claim 5, wherein the third wick structures have a conductive wire shape extending between upper surfaces of the first wick structures and upper surfaces of the second wick structures.

7. The semiconductor device of claim 5, wherein the third wick structures comprise:

first vertical capillary channels configured to move the liquid coolant in a vertical direction between the third wick structures; and second vertical capillary channels configured to move the liquid coolant in the vertical direction between the step and the third wick structures.

8. The semiconductor device of claim 1, further comprising fourth wick structures that connect together at least some of the first wick structures and at least some of the second wick structures that face each other.

9. The semiconductor device of claim 8, wherein the fourth wick structures have a conductive wire shape extending between upper surfaces of the first wick structures and upper surfaces of the second wick structures.

10. The semiconductor device of claim 1, further comprising a package housing surrounding the semiconductor chip, wherein the upper surface of the semiconductor chip is exposed from the package housing, wherein the vapor chamber is on an upper portion of the package housing.

11. The semiconductor device of claim 10, wherein the second wick structures comprise:

2nd-1 wick structures facing the first wick structures;

2nd-2 wick structures facing the 2nd-1 wick structures; and

2nd-3 wick structures between the 2nd-1 wick structures and the 2nd-2 wick structures.

12. The semiconductor device of claim 10, further comprising an additional semiconductor chip under the 2nd-2 wick structures and within the package housing.

13. A semiconductor device comprising:

a plurality of semiconductor chips stacked in a vertical direction, the plurality of semiconductor chips including a plurality of cooling channels respectively recessed in the plurality of semiconductor chips from upper surfaces of the plurality of semiconductor chips, the plurality of cooling channels configured to have a coolant flow in a liquid phase therein such as to absorb heat generated during an operation of the plurality of semiconductor chips;

a plurality of first wick structures on bottoms of the plurality of cooling channels that are respectively parallel to the upper surfaces of the plurality of semiconductor chips in a transverse direction, the plurality of first wick structures configured to move the coolant by capillary action in the transverse direction along the bottoms of the plurality of cooling channels;

a vapor chamber above an uppermost semiconductor chip among the plurality of semiconductor chips, the vapor chamber being in fluid communication with the plurality of cooling channels;

second wick structures on an inner surface of the vapor chamber and configured to move the coolant by capillary action in the transverse direction along the inner surface of the vapor chamber;

a connection channel penetrating the plurality of semiconductor chips except for lowermost semiconductor chip among the plurality of semiconductor chips;

third wick structures between the second wick structures and first wick structures, among the plurality of first wick structures, that are arranged on the uppermost semiconductor chip among the plurality of semiconductor chips, the third wick structures configured to move the coolant in the liquid phase by capillary action from the second wick structures to the first wick structures; and at least one fourth wick structure configured to move the coolant in the liquid phase by capillary action along the connection channel from the second wick structures to at least one of the plurality of first wick structures.

14. The semiconductor device of claim 13, wherein the plurality of first wick structures comprise a material that is different from a material included in the second wick structures.

15. The semiconductor device of claim 13, wherein the plurality of first wick structures comprise silicon, and the second wick structures comprise copper.

16. The semiconductor device of claim 13, wherein the third wick structures and the at least one fourth wick structure comprise copper.

17. The semiconductor device of claim 13, wherein the third wick structures connect together some of the first wick structures and some of the second wick structures that are closest to a step formed between the vapor chamber and the upper surfaces of the plurality of semiconductor chips, and wherein the third wick structures are spaced apart from the step toward an inside of the plurality of cooling channels by a capillary distance.

18. The semiconductor device of claim 13, wherein the at least one fourth wick structure comprises fourth wick structures that are spaced apart from a side wall of the connection channel toward the inside of the plurality of cooling channels by a capillary distance.

19. The semiconductor device of claim 13, further comprising fifth wick structures connecting together some of the first wick structures and some of the second wick structures that face each other, wherein the some of the first wick structures are on the uppermost semiconductor chip among the plurality of semiconductor chips.

20. The semiconductor device of claim 13, further comprising a plurality of package housings respectively surrounding the plurality of semiconductor chips, wherein the upper surfaces of the plurality of semiconductor chips are exposed from the plurality of package housings, respectively, and the vapor chamber is on an upper portion of one of the plurality of package housings that surrounds the uppermost semiconductor chip among the plurality of semiconductor chips.

* * * * *